(12) United States Patent
Park (10) Patent No.: US 7,754,557 B2
(45) Date of Patent: Jul. 13, 2010

(54) METHOD FOR MANUFACTURING VERTICAL CMOS IMAGE SENSOR

(75) Inventor: Jeong Su Park, Seoul (KR)

(73) Assignee: Dongbu HiTek Co., Ltd., Seoul (KR)

(*) Notice: Subject to any disclaimer, the term of this patent is extended or adjusted under 35 U.S.C. 154(b) by 33 days.

(21) Appl. No.: 12/146,360

(22) Filed: Jun. 25, 2008

(65) Prior Publication Data

US 2009/0004770 A1   Jan. 1, 2009

(30) Foreign Application Priority Data

Jun. 26, 2007   (KR) .................. 10-2007-0062701

(51) Int. Cl.
  *H01L 21/8238* (2006.01)
(52) U.S. Cl. .................. 438/199; 438/197; 438/75; 438/769; 257/E21.189; 257/E21.267; 257/E21.319; 257/E21.527; 257/E21.617; 257/E21.632
(58) Field of Classification Search .............. 438/70, 438/75, 197, 199, 341, 357, 363, 475, 663, 438/684, 722, 769; 257/E21.189, 267, 319, 257/527, 617, 632

See application file for complete search history.

(56) References Cited

U.S. PATENT DOCUMENTS

| 6,940,061 | B2 * | 9/2005 | Baharav et al. | 250/226 |
| 7,105,906 | B1 * | 9/2006 | Hopper et al. | 257/440 |
| 7,148,796 | B2 * | 12/2006 | Joy et al. | 340/521 |
| 7,268,925 | B1 * | 9/2007 | Green | 358/486 |
| 7,279,694 | B2 * | 10/2007 | Lai et al | 250/551 |
| 7,456,733 | B2 * | 11/2008 | Joy et al | 340/521 |
| 2005/0245019 | A1 | 11/2005 | Luo et al. | |
| 2006/0023107 | A1 * | 2/2006 | Bolken et al. | 348/335 |
| 2006/0273349 | A1 * | 12/2006 | Joon | 257/204 |

FOREIGN PATENT DOCUMENTS

CN   1820349   8/2006

* cited by examiner

*Primary Examiner*—David Nhu
(74) *Attorney, Agent, or Firm*—Workman Nydegger

(57) ABSTRACT

A method for manufacturing a vertical CMOS image sensor related to a semiconductor device is disclosed. A high-temperature double annealing process and/or an additional passivation nitride film are selectively applied in order to improve dark leakage characteristics and also to prevent or reduce an incidence of circular defects, thereby enhancing the quality and reliability of the vertical CMOS image sensor.

7 Claims, 10 Drawing Sheets

| Passivation | Aneal condition | | Remark |
|---|---|---|---|
| SiN | Final only | 400 | |
| | | 435 | |
| | | 450 | |
| | Double | 435+435 | Before deposition of passivation nitride and after final process |
| | | 435+450 | |
| SiON | Final only | 450 | Alternative passivation |

[Fig. 3b]

| Anneal temp (℃) | Passivation | % of defects |
|---|---|---|
| 400 | SiN | 1% |
| 435 | SiN | 7% |
| 450 | SiN | 15% |
| 435+435 | SiN | None |
| 435+450 | SiN | None |
| 450 | SiON | None |

METHOD FOR MANUFACTURING VERTICAL CMOS IMAGE SENSOR

CROSS-REFERENCE TO RELATED APPLICATION

This application claims the benefit of Korean Patent Application No. 10-2007-0062701, filed on Jun. 26, 2007, which is hereby incorporated by reference in its entirety as if fully set forth herein.

BACKGROUND OF THE INVENTION

1. Field of the Invention

The present invention relates to a semiconductor device, and more particularly to a method for manufacturing a vertical CMOS image sensor.

2. Discussion of the Related Art

In general, an image sensor is a semiconductor device which converts an optical image into an electrical signal. Image sensors are largely classified as a charge coupled device (CCD) or a complementary metal oxide silicon (CMOS) image sensor.

The CCD has a complicated drive system, has considerable power consumption, and requires a multi-step photo process. Moreover, it is disadvantageous in that a process of manufacturing the CCD is complicated. In particular, in the CCD, it is difficult to integrate a control circuit, a signal processing circuit, an analog/digital (A/D) converter, etc. on a CCD chip. Hence, it is difficult to reduce a size of the CCD.

Recently, a CMOS image sensor has been given attention as a next-generation image sensor that can overcome the disadvantages of the CCD.

The CMOS image sensor manufactured by a general CMOS process has advantages of low power consumption, a simple manufacturing process, low cost, and high integration.

The above-mentioned conventional CMOS image sensor is formed to have a stack structure including photodiodes and transistors. First, after a silicon epitaxial layer is formed, RGB color photodiodes are formed. Then, transistors are formed. Then, metal lines and via holes are formed. Then, after an upper metal layer is etched, a passivation oxide film and a passivation nitride film are formed by sequentially stacking the films. After the stack structure is completed, annealing is performed at a temperature of, generally, 400° C.

The conventional CMOS image sensor still has a problem of dark leakage characteristics. That is, the dark signal levels of the CMOS image sensor are still larger than those of a CCD manufactured by an optimal manufacturing process.

SUMMARY OF SOME EXAMPLE EMBODIMENTS

In general, example embodiments of the invention relate to a method for manufacturing a vertical CMOS image sensor having improved dark leakage characteristics through improved hydrogen annealing while preventing or reducing formation of circular defects in the image sensor.

Additional features will be set forth in part in the description which follows and in part will become apparent to those having ordinary skill in the art upon examination of the following or may be learned from practice of the teachings herein. Features of the invention may be realized and attained by means of the instruments and combinations particularly pointed out in the written description and claims hereof as well as the appended drawings.

According to one embodiment, a method for manufacturing a vertical CMOS image sensor comprises: forming at least one color photodiode on a silicon epitaxial layer; forming a transistor on the epitaxial layer having the color photodiode; forming at least one metal line on the transistor; forming a first passivation film after an uppermost metal layer is formed over the at least one metal line; performing a first annealing at a first high temperature after the first passivation film is formed; and forming a second, uppermost passivation film on the first passivation film.

The first passivation film may be a passivation oxide film and the first annealing may be performed at a temperature of 400 to 435° C.

The method may further include performing a second, final annealing at a second high temperature after the second, uppermost passivation film is formed. The second, final annealing may be performed at a temperature of 435 to 450° C.

The second, uppermost passivation film may be a passivation nitride film. In particular, the second, uppermost passivation film may be an SiON passivation film or an SiN passivation film.

This Summary is provided to introduce a selection of concepts in a simplified form that are further described below in the Detailed Description. This Summary is not intended to identify key features or essential characteristics of the claimed subject matter, nor is it intended to be used as an aid in determining the scope of the claimed subject matter. Moreover, it is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of example embodiments of the invention and are incorporated in and constitute a part of this application, illustrate the example embodiments and together with the description serve to explain particular features of the example embodiments. In the drawings.

DETAILED DESCRIPTION OF THE INVENTION

In the following detailed description of the embodiments, reference will now be made in detail to specific embodiments of the present invention, examples of which are illustrated in the accompanying drawings. Wherever possible, the same reference numbers will be used throughout the drawings to refer to the same or like parts. These embodiments are described in sufficient detail to enable those skilled in the art to practice the invention. Other embodiments may be utilized and structural, logical and electrical changes may be made without departing from the scope of the present invention. Moreover, it is to be understood that the various embodiments of the invention, although different, are not necessarily mutually exclusive. For example, a particular feature, structure, or characteristic described in one embodiment may be included within other embodiments. The following detailed description is, therefore, not to be taken in a limiting sense, and the scope of the present invention is defined only by the appended claims, along with the full scope of equivalents to which such claims are entitled.

Hereinafter, a direct CMOS image sensor having a unit pixel size of 3.3 μm×3.3 μm and an operational voltage of 2.8 V is referenced as an example. It will be appreciated, however, that the principles described are applicable to other CMOS image sensors.

A CMOS image sensor according to an embodiment of the present invention has a vertical three-layer structure and may be manufactured using a 0.18 μm CMOS logic technology through a single poly-5 metal process. Red and green photodiodes may be formed in a silicon epitaxial layer through three epitaxy steps before a moat pattern is formed. A blue photodiode may also be formed after a gate etching process.

To improve dark leakage characteristics of the CMOS image sensor an annealing process may be performed at a specific temperature. The annealing may employ hydrogen annealing.

The annealing temperature may be increased from a general temperature of 400° C. to a temperature of between 435° C. and 450° C. The increase of the annealing temperature improves the dark leakage characteristics of the CMOS image sensor. However, various side effect phenomena may result from the increase of the annealing temperature.

The side effect phenomena relate to materials of a metal layer, an inter-metal dielectric (IMD) layer, and the like. For example, a circular defect, i.e. a crack in a dielectric material of the IMD layer, occurs as a side effect phenomena. The circular defect occurs due to a difference between thermal expansion coefficients of metal and dielectric materials of the IMD layer.

Accordingly, a high-temperature double annealing process and/or a passivation nitride film different from a conventional passivation nitride film may be employed to prevent or reduce circular defects that can occur as a side effect of an increased annealing temperature.

The double annealing process may include a first annealing (i.e., pre-annealing) and a second, final annealing. Pre-annealing may first be performed at a temperature of 400 to 435° C. After the pre-annealing is performed, nitride may be deposited on the passivation oxide film to form a passivation nitride film. Then, final annealing may be performed at a higher temperature, for example, at 435 to 450° C.

Figure 1A:
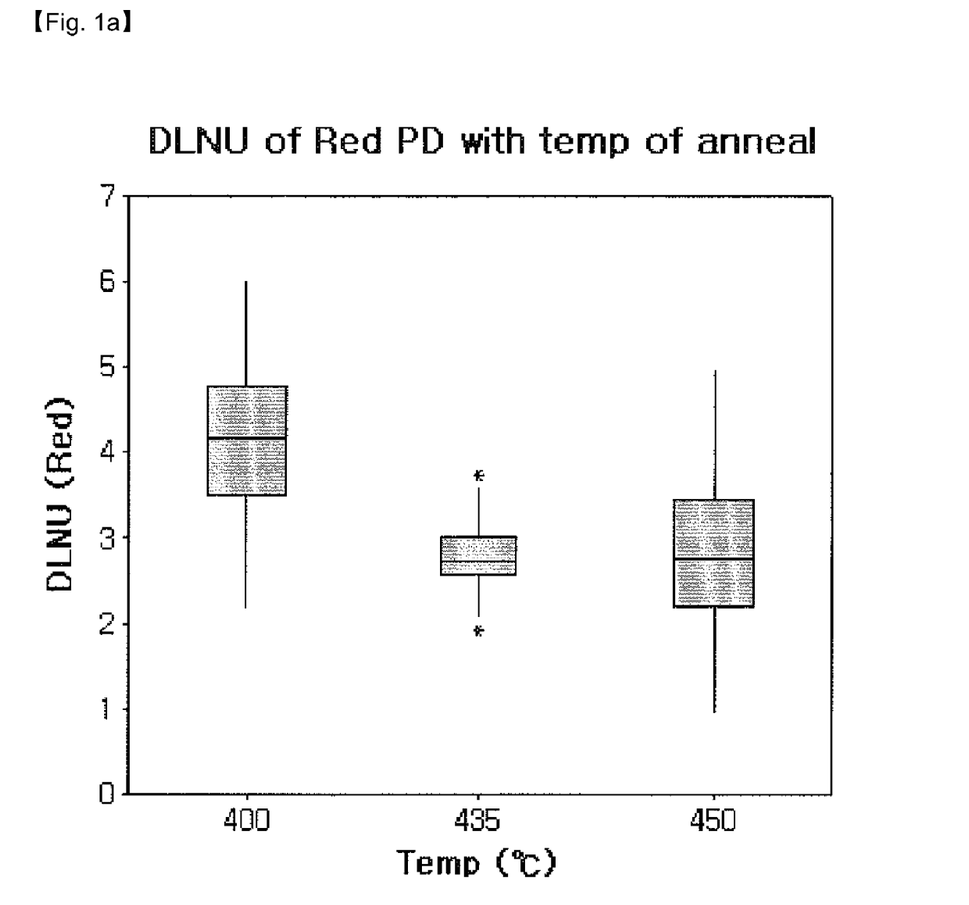
FIGS. 1A to 1C illustrate graphs showing dark leakage non-uniformity (DLNU) of color photodiodes according to the temperature in $H_2$ annealing.
Figure 1B:
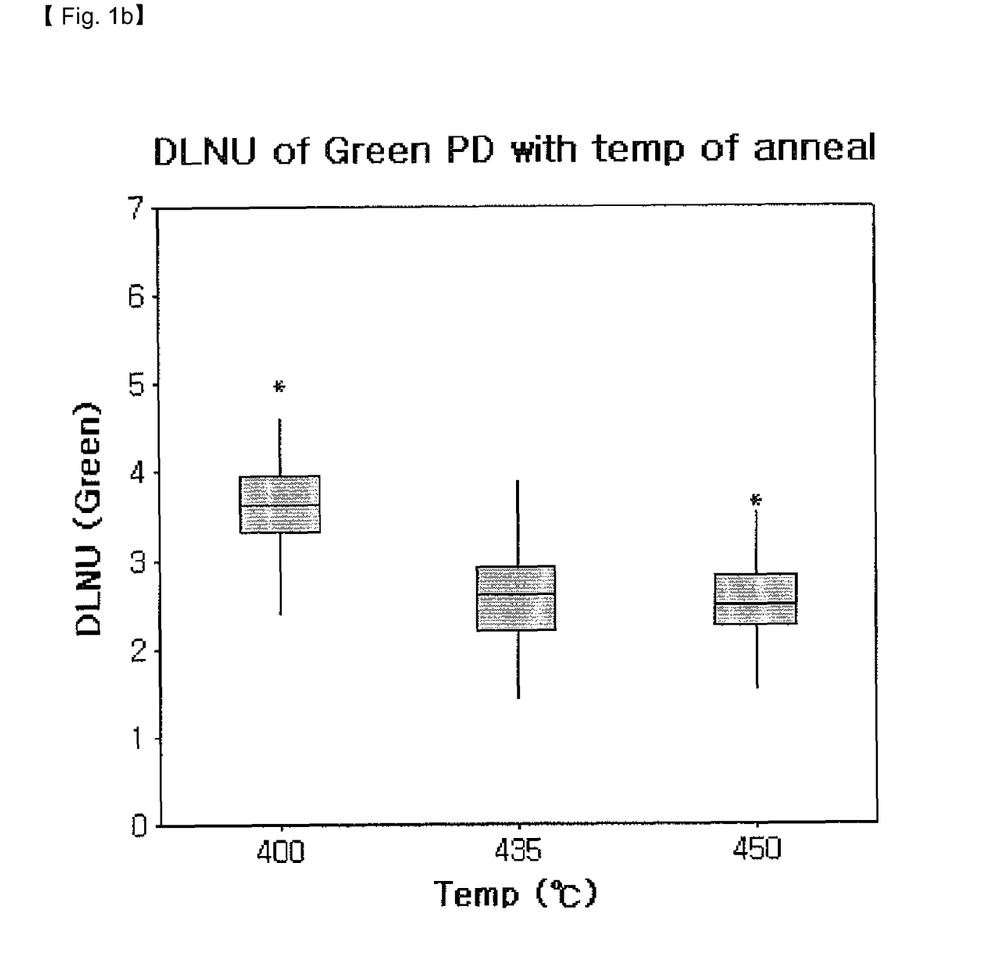
Figure 1C:
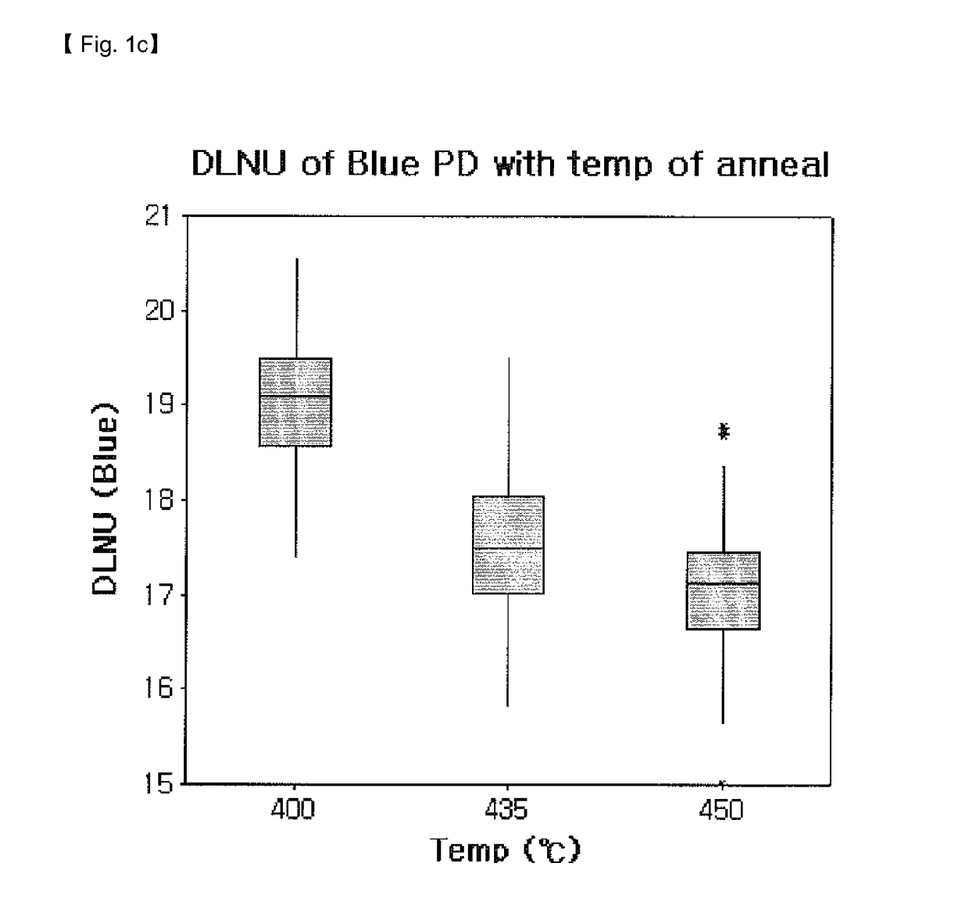

FIGS. 1A to 1C illustrate graphs showing dark leakage non-uniformity (DLNU) of color photodiodes versus an $H_2$ (hydrogen) annealing temperature.

Generally, hydrogen annealing heals defects in the silicon layer, at edges of STI films, and in the IMD layer of the CMOS image sensor.

The healing effects of hydrogen annealing are illustrated in the graphs of FIGS. 1A to 1C. As apparent from the graphs, higher annealing temperatures are more effective at reducing DLNU and thus improving image sensor quality. Further, since the blue photodiode is positioned closer to the surface of the silicon layer than other photodiodes, the high-temperature annealing is more effective on the blue photodiode disposed in the third epitaxial layer.

Figure 2A:
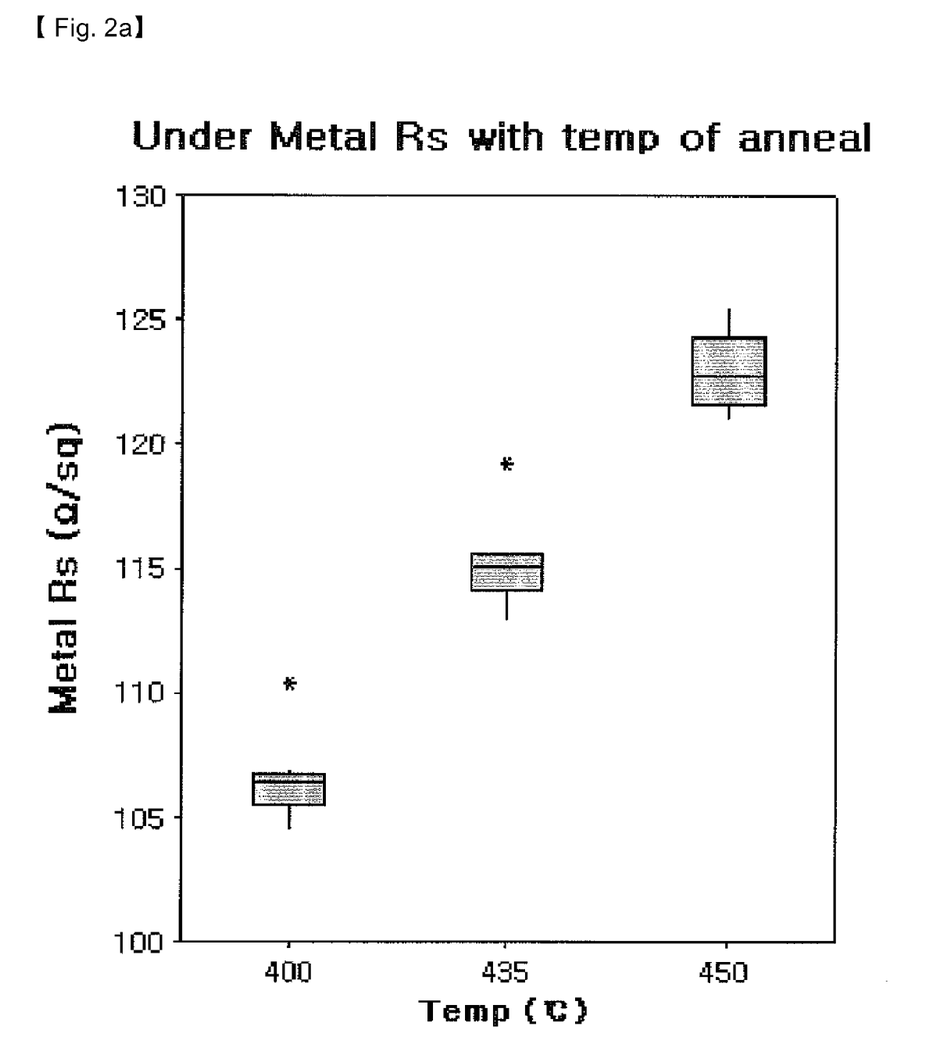
FIGS. 2A and 2B depict graphs showing influences of $H_2$ annealing temperatures on metal layers.
Figure 2B:
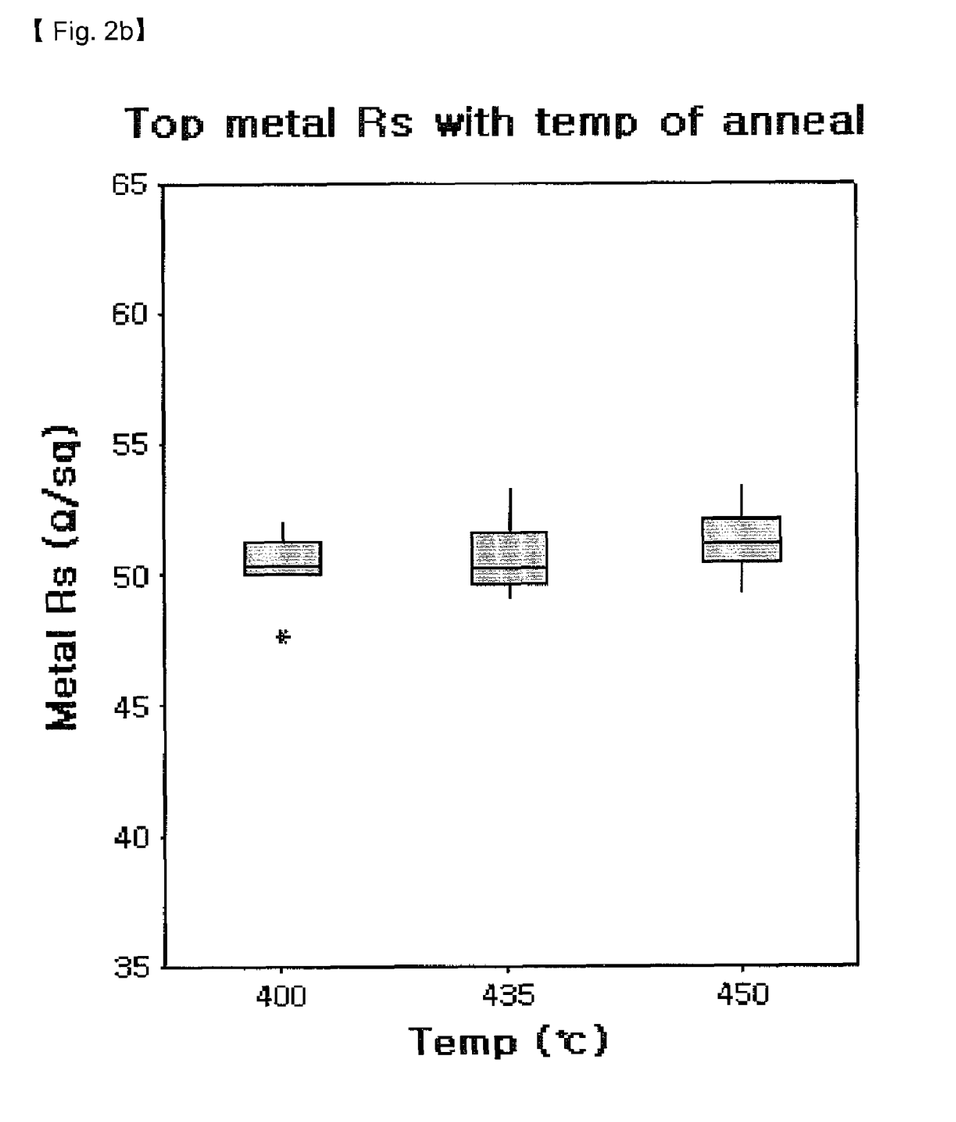

FIGS. 2A and 2B depict graphs showing influences of $H_2$ annealing temperatures on metal layers. In particular, the graph of FIG. 2A illustrates a relation between the sheet resistance (Rs, Ω/sq) of an under (i.e., lower) metal layer versus temperature and the graph of FIG. 2B illustrates a relation between sheet resistance (Rs, Ω/sq) of a top (i.e., upper) metal layer versus temperature.

The sheet resistance of a lower metal layer is more radically changed than the sheet resistance of an upper metal layer by the increased temperature. The sheet resistance is more radically changed in the lower metal layer during the hydrogen annealing because a concentration or level of titanium aluminide is made higher in the lower metal layer than in the upper metal layer and because the lower metal layer undergoes greater expansion in volume in correspondence with higher annealing temperatures.

As a result, a circular defect that causes a crack may be more easily formed in the dielectric material of the IMD layer touching the lower metal layer. The circular defect influences reliability of the IMD layer and the metal layer.

In particular, the circular defect is more easily generated due to a difference that generally exists between the thermal expansion coefficients of the lower metal layer and the dielectric materials of the IMD layer. During the hydrogen annealing, the metal material in the lower metal layer expands more than the dielectric material in the IMD layer. Accordingly, the dielectric material disposed in a corner of the metal material undergoes tensile residual stress. Further, the corner of the metal material begins to crack, and the crack can propagate during a cooling period.

Figure 3A:
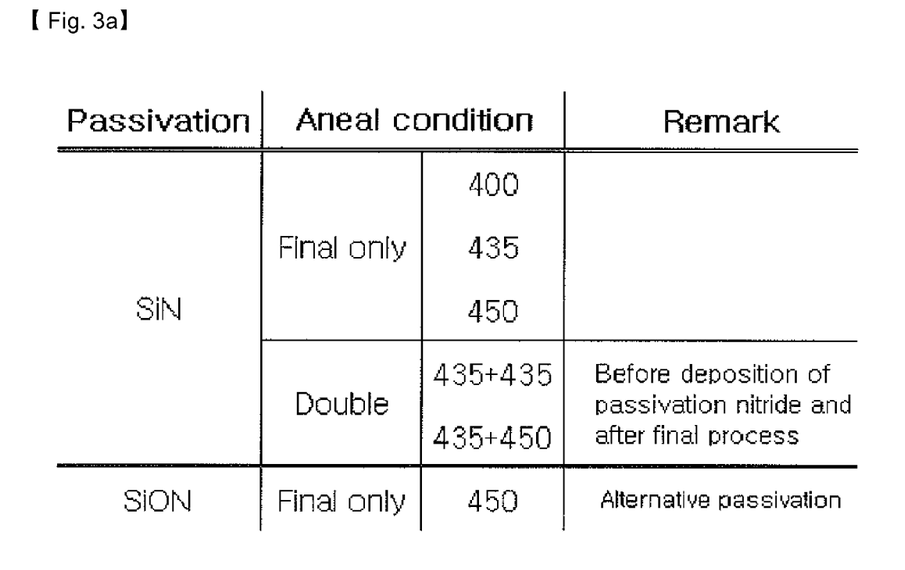
FIG. 3A is a table showing different annealing conditions.
Figure 3B:
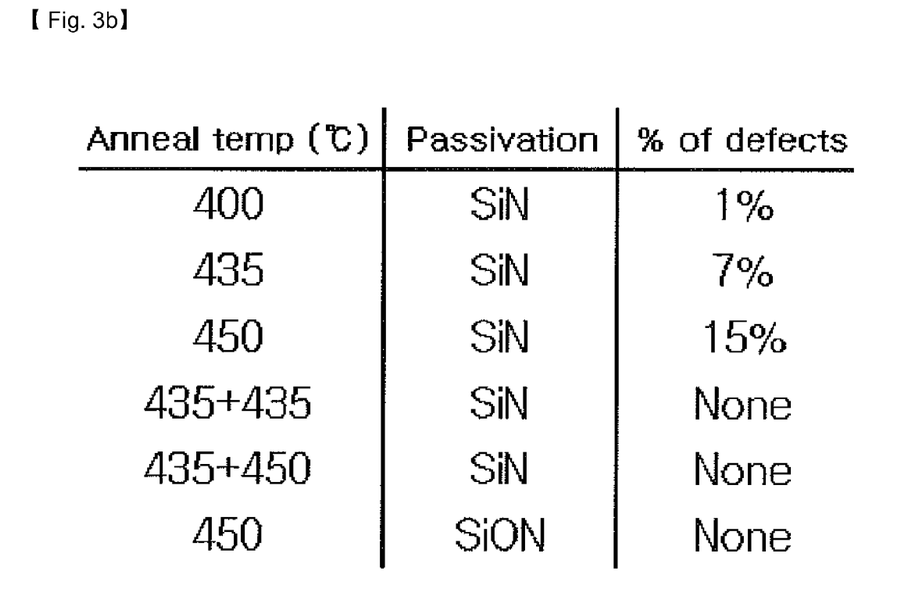
FIG. 3B is a table showing a defect generation rate corresponding to each of the different annealing conditions.

FIG. 3A is a table showing different annealing conditions. FIG. 3B is a table showing a defect generation rate corresponding to each of the different annealing conditions.

The first three entries in the tables correspond to a single "final" annealing being performed after formation of an entire stack structure, including deposition of an uppermost silicon nitride (SiN) passivation film. Under those annealing conditions, the number of defects increases as the hydrogen annealing temperature increases, as shown in FIG. 3B.

In order to prevent or reduce the defects generated due to the increase of the temperature, a double annealing process may be performed. In the double annealing process, a first annealing process may be performed before the passivation nitride film is deposited, and a second annealing process may be performed after deposition of nitride in the passivation oxide film is completed. The first annealing process effectively relieves stress of the dielectric materials in the IMD layer. Accordingly, a circular defect is less likely to be generated during or after the second annealing process.

Furthermore, an alternative passivation nitride film, such as silicon oxynitride (SiON), may be used in addition to or instead of the double annealing process. Generally, SiON has a lower thermal expansion coefficient than SiN due to strong covalent bonding between silicon and nitride. Accordingly, SiN is easily cracked by repeated thermal treatment, and thus SiN is more easily broken by an annealing process than SiON. The cracking defects, which are also circular defects, are caused by mismatching temperatures of the metal material and the passivation nitride film. The oxygen included in SiON, on the other hand, serves to relieve expansion stress.

Figure 4A:
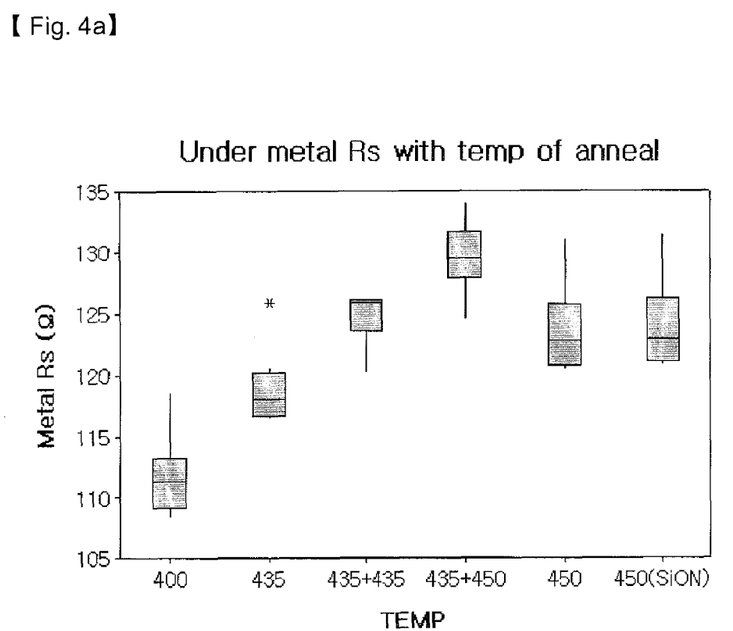
FIGS. 4A and 4B depict graphs showing influences of different annealing conditions on a lower metal layer.
Figure 4B:
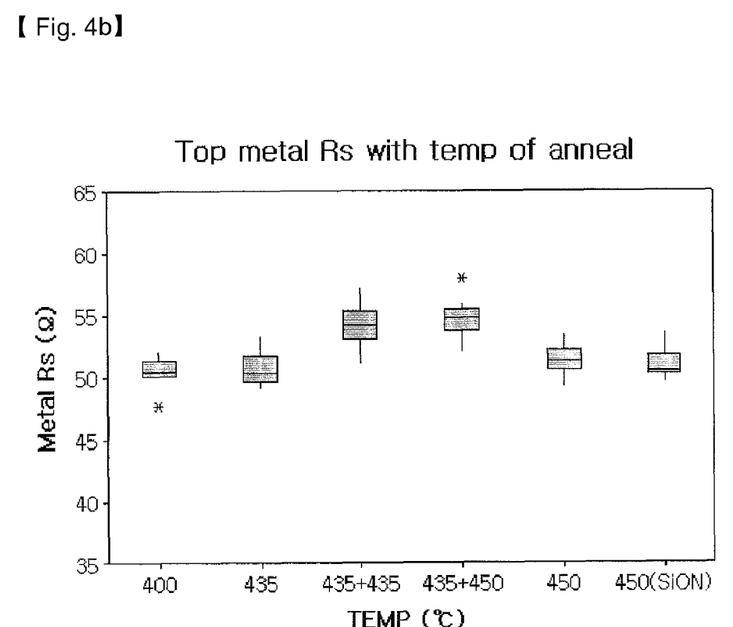

FIGS. 4A and 4B depict graphs showing influences of different annealing conditions on the lower metal layer, which illustrate a relation between the sheet resistance (Rs, Ω/sq) of the metal layer and temperature.

In the double annealing process, more titanium aluminide is formed in the lower metal layer since the sheet resistance of the metal layer is higher than that of a metal layer annealed by a single-step annealing process. However, the circular defect is not generated in the double annealing process because the first annealing process, which is performed before the passivation nitride film is deposited, serves to relieve the stress.

Figure 5A:
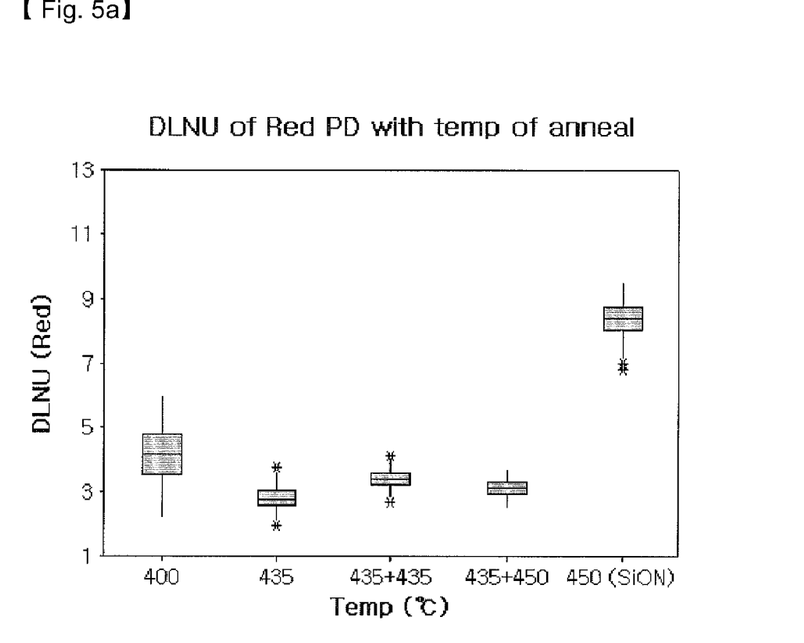
FIGS. 5A to 5C illustrate graphs showing DLNU of color photodiodes according to different annealing conditions and their corresponding temperatures.
Figure 5B:
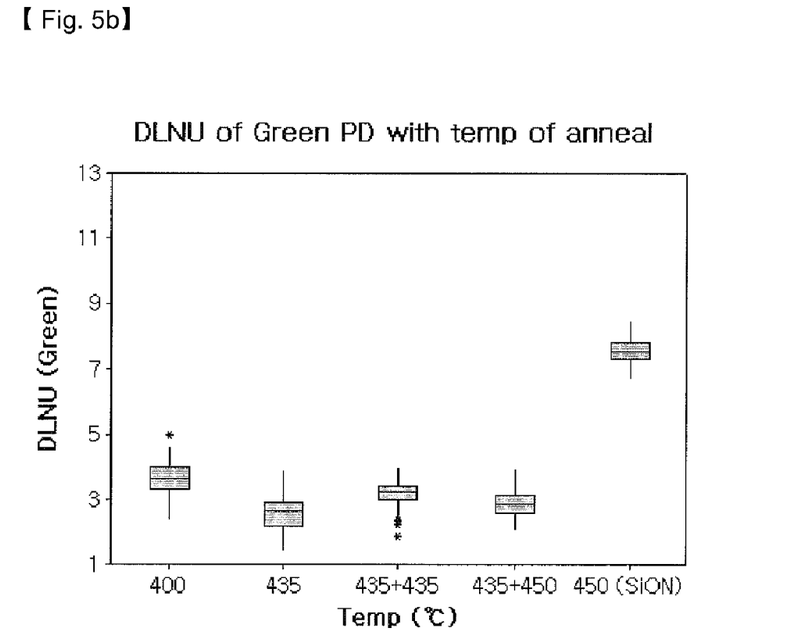
Figure 5C:
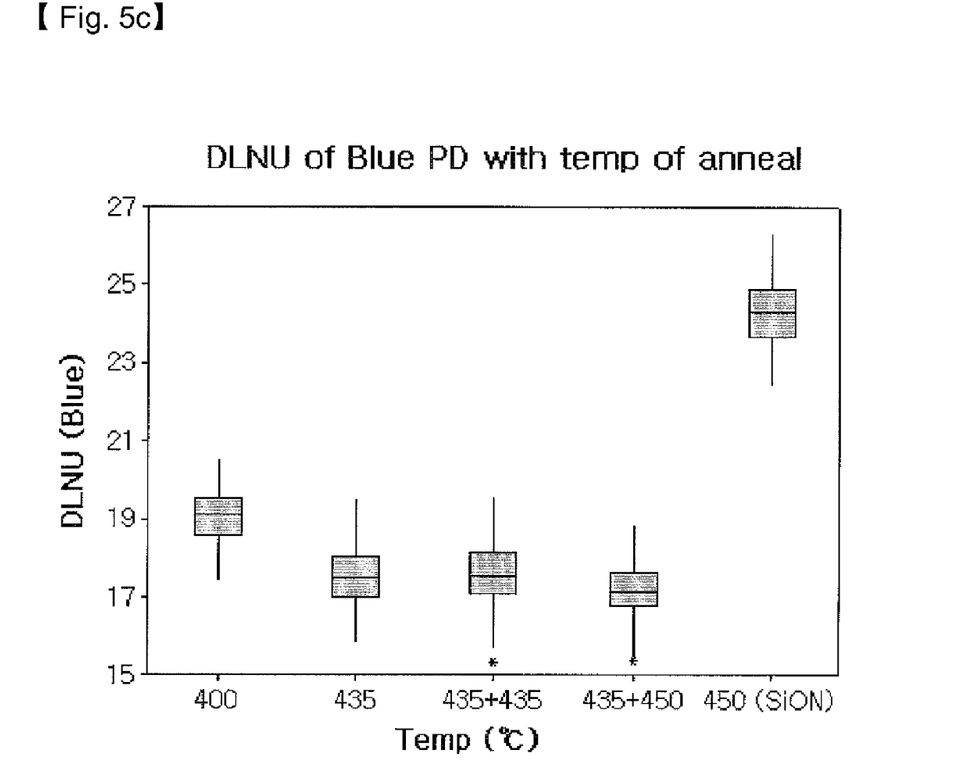

FIGS. 5A to 5C illustrate graphs showing DLNU of color photodiodes according to different annealing conditions and their corresponding temperatures.

As shown in the graphs of FIGS. 5A to 5C, the double annealing process more efficiently improves the dark leakage characteristics than a single-step hydrogen annealing at 400° C. performed after final deposition. In addition to improving the dark leakage characteristics, the double annealing process also efficiently prevents or reduces circular defects.

Moreover, although an SiON passivation film prevents or reduces an incidence of circular defects, it is less effective than SiN because its refractive index differs. The refractive index (1.69) of SiON is lower than the refractive index (2.1) of SiN. Accordingly, SiON has a larger depth of light transmission than SiN and a focus is not formed on the silicon layer when SiON is used.

Therefore, use of the SiON passivation film to remove the circular defect is optional, taking both visual gain and necessity for the vertical CMOS image sensor into consideration. Thus, either SiON or SiN may selectively be used as the passivation oxide film formed at the uppermost portion.

Consequently, hydrogen annealing at an increased temperature is performed to improve the dark leakage characteristics after final deposition of an uppermost passivation film. Moreover, to reduce or avoid circular defects that negatively impact device reliability, a double annealing process and/or a SiON passivation nitride film may be selectively employed to counteract against circular defects.

Figure 6:
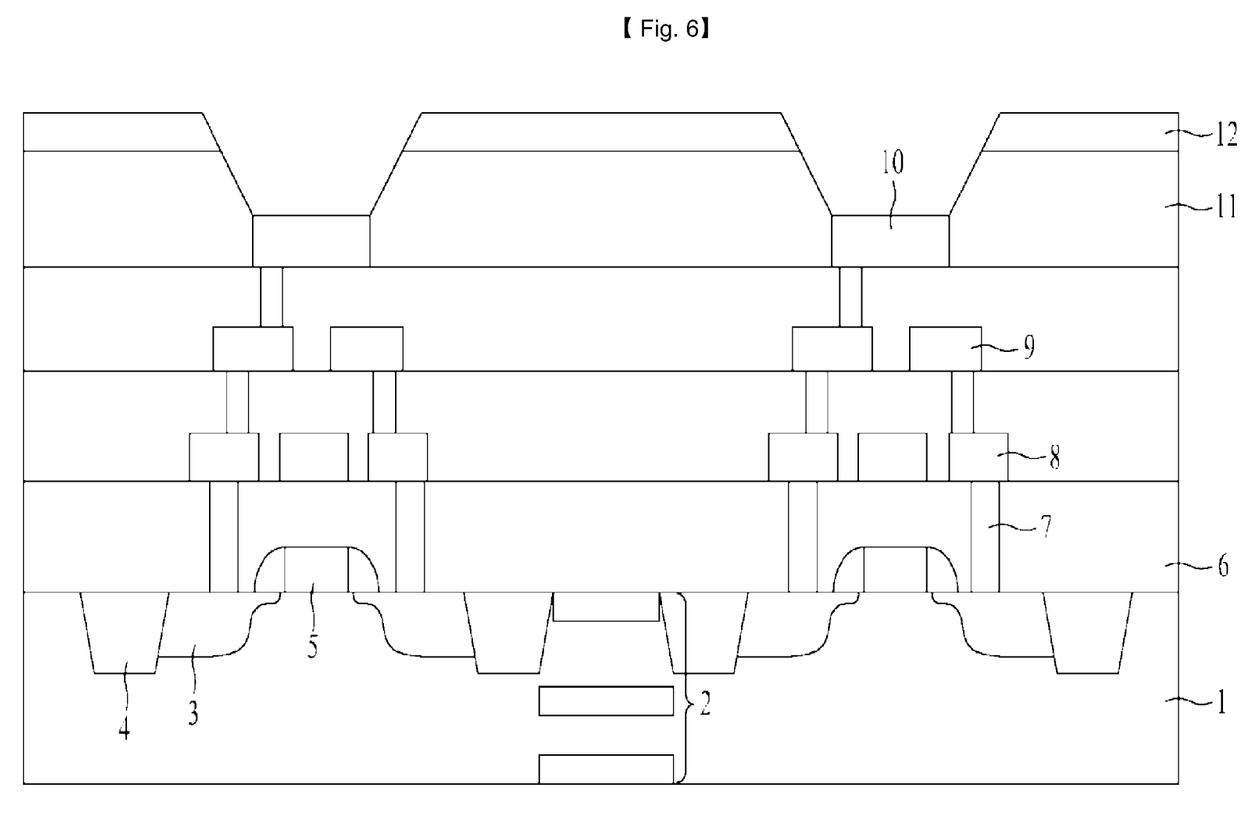
FIG. 6 illustrates a stack structure of a vertical CMOS image sensor manufactured according to an embodiment of the present invention.

FIG. 6 illustrates a stack structure of a vertical CMOS image sensor that may be manufactured according to exemplary methods described above.

The CMOS image sensor includes photodiodes and transistors. First, after a silicon epitaxial layer 1 (e.g., a three-layer structure) is formed, RGB color photodiodes 2 may be formed on the silicon epitaxial layer 1. Then, transistors may be formed by sequentially forming sources/drains 3, shallow trench isolation (STI) films 4 and gates 5.

An IMD layer 6 may be deposited thereon after the transistors are formed, and via holes 7 may be formed in the IMD layer 6. The via holes 7 electrically connect between metal lines to be formed, and electrically connect between the metal lines and the transistors. Then, metal lines 8 and 9 may be formed thereon and an uppermost metal layer 10 may be formed.

After an etching process for forming the uppermost metal layer 10, oxide may be deposited to form a passivation oxide film 11. After the passivation oxide film 11 is formed, pre-annealing, which is a first step of the double annealing process, may be performed. The annealing temperature for the pre-annealing step may be maintained at 400 to 435° C.

After the pre-annealing is performed, nitride may be deposited on the passivation oxide film 11 to form a passivation nitride film 12. After the passivation nitride film 12 is formed, final annealing, which is a second step of the double annealing process, may be performed. The annealing temperature for the final annealing step may be maintained higher than the temperature of the pre-annealing step, for example, at 435 to 450° C.

While the dark leakage characteristics may be improved by increasing the annealing temperature, a high-temperature double annealing process and/or an additional passivation nitride film, such as SiON, may be selectively applied to also remove circular defects, thereby enhancing the quality and reliability of the vertical CMOS image sensor.

In fact, the high temperature double annealing process alone, i.e., without use of a SiON passivation nitride film, improves dark leakage characteristics while preventing or reducing circular defects.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A method for manufacturing a vertical CMOS image sensor comprising:
   forming at least one color photodiode on a silicon epitaxial layer;
   forming a transistor on the silicon epitaxial layer having the color photodiode;
   forming at least one metal line;
   forming a metal layer above the metal line;
   forming a first passivation film;
   performing a first annealing at a first temperature;
   forming a second passivation film above the first passivation film; and
   performing a second annealing at a second temperature, wherein the second temperature is higher than the first temperature.

2. The method according to claim 1, wherein the first passivation film is a passivation oxide film.

3. The method according to claim 1, wherein the first annealing is performed at a first temperature of 400 to 435.degree. C.

4. The method according to claim 1, wherein the second, annealing is performed at a second temperature of 435 to 450.degree. C.

5. The method according to claim 1, wherein the second, passivation film is a passivation nitride film.

6. The method according to claim 1, wherein the second, passivation film is a SiON passivation film.

7. The method according to claim 1, wherein the second, passivation film is a SiN passivation film.

* * * * *